United States Patent [19]

Hsu et al.

[11] Patent Number: 5,113,091

[45] Date of Patent: May 12, 1992

[54] APPARATUS AND METHOD FOR COMPARING SIGNALS

[75] Inventors: Wei-chan Hsu, Plano; William R. Krenik, Dallas, both of Tex.

[73] Assignee: Texas Instruments Incorporated, Dallas, Tex.

[21] Appl. No.: 672,146

[22] Filed: Mar. 19, 1991

Related U.S. Application Data

[63] Continuation of Ser. No. 560,259, Jul. 27, 1990, abandoned, which is a continuation of Ser. No. 196,596, May 20, 1988, abandoned.

[51] Int. Cl.[5] .............................................. H03K 5/24
[52] U.S. Cl. .................................. 307/355; 307/356; 307/362; 307/491
[58] Field of Search ............... 307/355, 356, 357, 362, 307/491

[56] References Cited

U.S. PATENT DOCUMENTS

| | | | |
|---|---|---|---|
| 3,657,563 | 4/1972 | Davis | 307/251 |
| 4,262,221 | 4/1981 | Dingwall | 307/355 |
| 4,532,438 | 7/1985 | Reiner | 307/355 |
| 4,656,429 | 4/1987 | Masuda et al. | 307/355 |
| 4,710,724 | 12/1987 | Connell et al. | 307/362 |
| 4,748,418 | 5/1988 | Kerth | 307/362 |

OTHER PUBLICATIONS

Gregorian et al., Analog MOS Integrated Circuits for Signal Processing, Section 6.3, "MOS Comparators", pp. 425–437 published by John Wiley & Sons, 1986.

Primary Examiner—John Zazworsky
Attorney, Agent, or Firm—B. Peter Barndt; Richard L. Donaldson

[57] ABSTRACT

An amplifier includes an input circuit for alternately selecting input signals to be compared and a first bias circuit for producing self-bias when one of the input signals is selected. A second bias circuit stores the self-bias for use in the amplifier when the other of the input signals is selected for rejecting noise which may accompany power supply voltage applied to the amplifier.

14 Claims, 4 Drawing Sheets

APPARATUS AND METHOD FOR COMPARING SIGNALS

This application is a continuation of application Ser. No. 07/560,259, filed Jul. 27, 1990, now abandoned, which is itself a continuation of application Ser. No. 07/196,596, filed on May 20, 1988, now abandoned.

FIELD OF THE INVENTION

This invention relates to comparators and particularly to comparators employing dynamically self-biased transistor amplifiers subject to power supply noise effects.

BACKGROUND OF THE INVENTION

Comparators are useful in a variety of applications where one wishes to obtain a digital representation of the relative magnitudes of two (or more) analog input signals. In certain applications it is desirable that the comparator be of relatively simple construction and include some form of drift compensation (e.g., automatic zeroing). An example of such an application is in so-called "flash" analog to digital converters which may employ as many as $2 \exp(N) - 1$ comparators where N equals the number of bits in the converted digital signal. Eight-bit direct ("flash") converters, for example, may require as many as 255 comparators. This large number of comparators, as a practical matter, precludes use of complex differential amplifier configurations.

A comparator of relatively simple construction and which features drift compensation is described by Davis in the commonly assigned U.S. Pat. No. 3,657,563 entitled AC COUPLED COMPARATOR AND A/D CONVERTER which issued Apr. 18, 1972. An embodiment of an analog to digital converter shown by Davis includes a comparator in which input signals to be compared are AC coupled to a three stage (inverting) MOS transistor amplifier. Automatic zeroing is achieved by applying a first of two input signals to be compared to the amplifier input via a coupling capacitor while shorting the amplifier input/output terminals. The short circuit causes the amplifier to self-bias itself to an operating region of maximum gain and linearity and causes the input coupling capacitor to store an offset or compensating voltage equal to the difference of the input signal voltage and the amplifier self-bias voltage.

After automatic zeroing, the short circuit is removed and the second input signal is substituted for the first input signal. Since the amplifier offset was stored in the coupling capacitor during the auto-zero interval and the same capacitor is used during the comparison interval for coupling the second input signal, the amplifier offset is effectively cancelled and the amplifier output signal polarity thus provides an accurate indication of the relative magnitudes of the two input signals.

In the embodiment of the Davis comparator discussed above, the amplifier was implemented by connecting three non-complementary MOS transistor amplifier stages in cascade. Comparators of similar construction have been described using fewer amplifier stages and employing complementary MOS (CMOS hereafter) inverter stages for amplification. Examples of comparators employing dynamically self-biased CMOS inverter amplifier stages are described by Gregorian et al. in the text book ANALOG MOS INTEGRATED CIRCUITS FOR SIGNAL PROCESSING, Section 6.3 "MOS Comparators" pp. 425-437, published by John Wiley & Sons in 1986.

In examples of CMOS comparators described by Gregorian et al., input signals to be compared are alternately applied by a coupling capacitor to the input node of a CMOS inverter. The inverter includes a switch connected between the inverter input and output nodes and power terminals connected to sources of positive (Vdd) and negative (Vss) supply voltage. During auto zeroing, a reference (ground) level signal is applied to the coupling capacitor and the amplifier feedback switch is closed thereby self-biasing the amplifier and charging the capacitor to a voltage equal to the difference between the reference value (ground) and the amplifier self-bias operating point voltage. In the compare mode the input voltage to be compared (against ground level) is applied to the capacitor and the feedback switch is opened thus enabling the CMOS inverter to amplify (sense) the difference between the input voltages. As in the Davis arrangement, storage of the amplifier self-bias voltage in the coupling capacitor during the auto-zero and compare phases effectively corrects for amplifier offset and drift effects (assuming the drift to be negligible during the comparator cycle time).

SUMMARY OF THE INVENTION

The present invention resides in a first respect in the discovery of heretofore unrecognized problem concerning AC coupled comparators of the type discussed. It has been discovered that comparators of the general type described by Davis are relatively insensitive to power supply noise effects whereas comparators employing CMOS amplifiers as proposed by Gregorian et al. are very noise sensitive. This undesirable characteristic tends to preclude the use of the "CMOS" type of comparator in certain applications. For example, power supply noise tends to be relatively high in analog-to-digital converters constructed in integrated circuit form because of the presence of analog elements (e.g., comparators) and digital elements (e.g., clocks, gates, etc.) on the same semiconductor substrate. The digital circuits, being essentially switching devices, tend to induce noise in the circuit supply voltage lines which can interfere with the essentially analog function of the comparators used in the converter.

It is herein recognized that the higher power supply noise sensitivity of the Gregorian et al. comparators is due, in part, to the use of CMOS amplifiers as active gain elements. Conventional (non-complementary) amplifiers are relatively insensitive to supply noise because of the use of passive load elements. In CMOS amplifiers of conventional design, however, each transistor serves, so to speak, as an active (amplifying) load for the other transistor. Such amplifiers, when self-biased for use in analog applications, exhibit very high noise sensitivity because, prior to the present invention, any variation of transistor source electrode supply voltage of a self-biased CMOS inverter would necessarily modulate the transistor gate-to-source voltage and thus produce drain current variations. It is herein recognized that an effect of such drain current variations in a comparator application is to create offset errors during the self-bias (automatic-zero) cycle which are uncorrectable.

To make matters worse, noise present on the supply lines of a self-biased CMOS inverter is not merely added to the inverter output. It is, in fact, amplified by the inverter. Specifically, for a CMOS inverter constructed with transistors of substantially equal values of transconductance, the gain for signals applied to one power input terminal is only 6 dB less than the gain of the inverter for input signals applied to the inverter input. Thus, if a self-biased CMOS inverter has a gain of 26 dB and is subjected to one millivolt of noise at one supply terminal, the noise produced at the inverter output will be ten millivolts or fully one order of magnitude larger than the supply voltage noise.

If one were aware of the problem of noise susceptibility in comparators employing CMOS amplifiers (inverters), one might attempt to correct the problem by conventional methods such as filtering, shielding or constructing lower impedance power supply lines. Alternatively, one might consider employing fully differential amplifier configurations which inherently provide a high level of power supply noise rejection. One might also consider the possibility of decreasing the transconductance of one transistor of the CMOS inverter relative to the other transistor to cause the one transistor to function more as a passive load device rather than as an active amplifying element of the inverter.

Such conventional approaches to the problem of noise rejection, however, have various shortcomings. Techniques such as filtering, shielding and constructing low impedance supply lines are frequently impractical in integrated circuit applications. The use of fully differential amplifiers is not practical where large numbers of comparators are required (e.g., flash converters) or other applications where circuit simplicity is otherwise desired. The transconductance reduction technique has the disadvantage of also reducing the amplifier gain for input signals and thus can result in a more complex circuit if additional stages are added to compensate for the reduced gain.

The present invention is directed in a first respect to meeting the need for a dynamically biased CMOS comparator having a high degree of power supply noise rejection and which overcomes the disadvantages of the known comparators and the aforementioned conventional techniques of noise suppression.

A method of comparing input signals, in accordance with an aspect of the invention, includes the steps of selectively applying the input signals to an amplifier, producing a self-bias for the amplifier when one of the input signals is applied and storing the self-bias for application to the amplifier when another of the input signals is applied.

Apparatus for comparing input signals, in accordance with an aspect of the invention, includes an amplifier and an input circuit for selectively applying the input signals to the amplifier. A first bias circuit produces a self-bias for the amplifier when one of the input signals is applied. A second bias circuit stores the self-bias for application to the amplifier when another of the input signals is applied.

BRIEF DESCRIPTION OF THE DRAWING

The foregoing and further aspects of the invention are illustrated in the accompanying drawing wherein like elements are denoted by like reference designators and in which.

DETAILED DESCRIPTION

Figure 1:
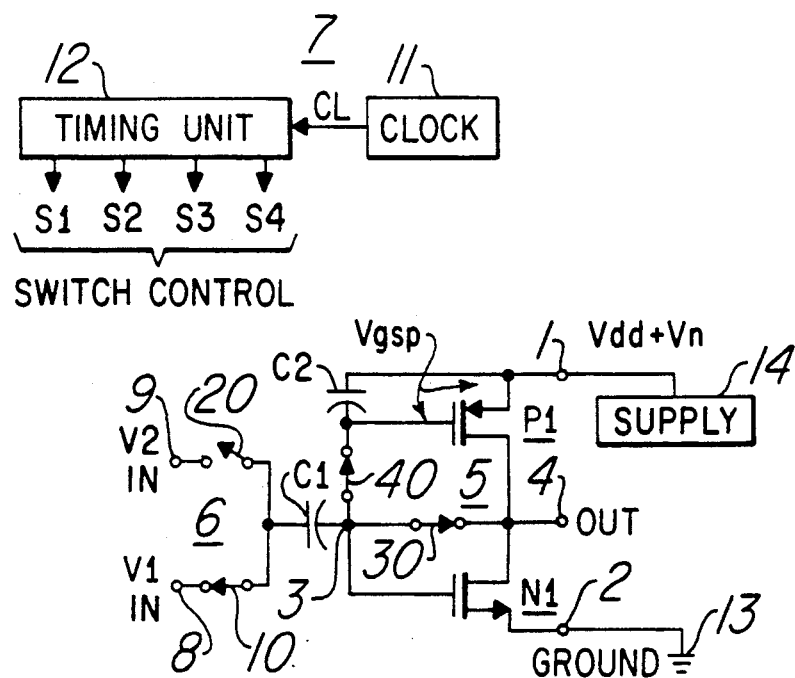
FIG. 1 is a circuit diagram, partially in block form, of a CMOS comparator embodying the invention.

The comparator of FIG. 1 includes an amplifier 5, an input circuit 6 and a timing signal generator 7. Amplifier 5 comprises a pair of complementary MOS transistors P1 and N1 having drain electrodes connected to an output terminal 4 and source electrodes connected to respective ones of first and second supply voltage terminals 1 and 2. The gate electrode of P-channel transistor P1 is coupled to supply terminal 1 via a capacitor C2 and to an amplifier input terminal 3 via a switch 40. Amplifier input terminal 3 is also connected to the gate electrode of N-channel transistor N1 and coupled via a switch 30 to output terminal 4.

Input circuit 6 includes first and second input terminals 8 and 9) for receiving first and second input signals (V1 and V2) to be compared. Circuit 6 alternately couples input signals V1 and V2 to input 3 of amplifier 5 by means of an input capacitor C1 having a first plate thereof connected to input 3 and a second plate thereof coupled to the first and second comparator input terminals (8 and 9) via respective ones of switches 10 and 20.

Timing signal generator 7 includes a clock signal source 11 coupled to supply clock signals CL to a timing unit 12 which generates a plurality of switch control signals S1, S2, S3 and S4 for controlling switches 10, 20, 30 and 40, respectively. Unit 7 may be of any suitable form of construction provided it produces switch control signals having timing relationships similar in overall effect to the exemplary timing signal relationships shown in FIG. 2 and discussed subsequently.

Operating power for amplifier 5 is provided by connecting supply terminal 2 to a source of substantially noise-free reference potential (e.g., ground 13, as shown) and by connecting supply terminal 1 to a source of relatively positive potential which may be subjected to noise pick-up. This is illustrated by supply 14 which is coupled to supply a positive supply voltage Vdd having a noise component Vn to supply terminal 1.

The condition of having a substantially noise-free supply and a supply subject to noise may be encountered in applications where the comparator of FIG. 1 is fabricated in an integrated circuit which includes digital elements (such as timing generator 7) along with analog elements (e.g., amplifier 5) which share a common supply voltage. Analog to digital converters are exemplary of such applications. As previously explained, noise produced by switching of the digital elements may be conveyed to the analog elements (comparators) via the Vdd supply lines which, generally speaking, are of relatively high impedance as compared to ground points in the integrated circuit and thus more susceptible to noise pick-up. If amplifier 5 were of the conventional CMOS design previously discussed, the presence of the supply voltage noise component Vn at the source electrode of P-channel transistor P1 would cause variation of the gate-to-source voltage Vgsp of the P-channel transistor thereby producing drain current variations during the auto-zero interval of the comparator and these variations would be manifested in operation of the comparator as uncorrectable offset errors.

In accordance with an aspect of the invention, a first bias circuit comprised of switch 30 produces a self-bias voltage when closed. The bias voltage $V_{gap}$ for transistor P1 is rendered insensitive to the noise component $V_n$ by means of the second bias circuit including capacitor C2 and switch 40 which stores the self-bias voltage. The second bias circuit applies the stored self-bias voltage across the gate and source electrodes of transistor P1 when switch 30 is open. As will be explained, this maintains the drain current of transistor P1 constant during the compare cycle of the comparator notwithstanding variations in the source electrode voltage due to noise. The timing of switch 40, as will be explained, has the further effect of ensuring that power supply noise components are excluded from storage in the coupling capacitor C1 where they would otherwise cause comparison errors.

Figure 2:
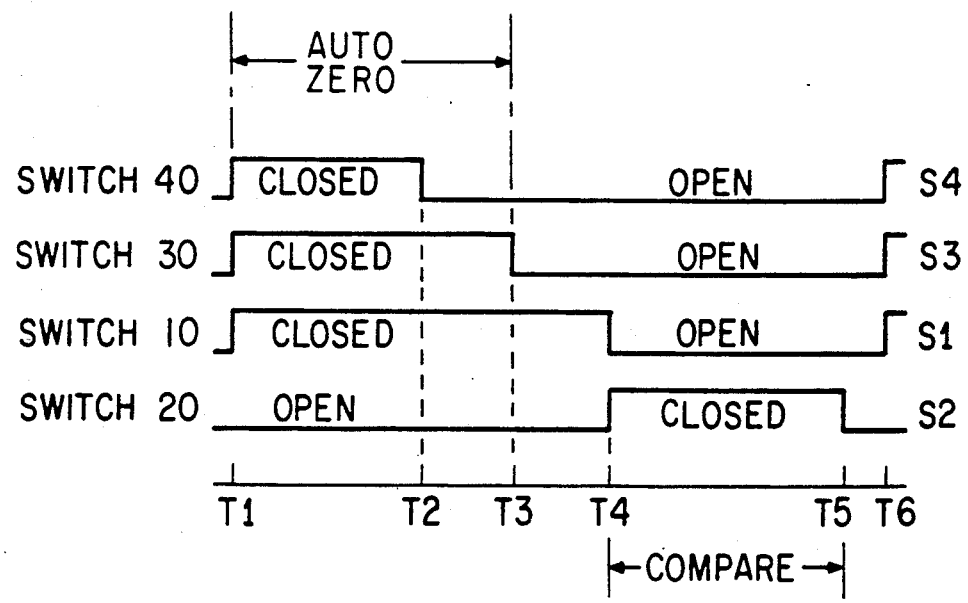
FIG. 2 is a timing diagram illustrating certain aspects of operation of the comparator of FIG. 1.

The foregoing and other features of the comparator of FIG. 1 will now be described in detail with reference to the timing diagram of FIG. 2. The automatic zeroing cycle (auto-zero) begins at time T1 with the closure of switches 10, 30 and 40. At this time the first one (V1) of two input signals to be compared (V1 and V2) is coupled via input coupling capacitor C1 to the input node 3 of CMOS amplifier 5. Closure of switches 30 and 40 connects the gate electrodes of transistors P1 and N1 to their commonly connected drain electrodes thereby self-biasing amplifier 5 for linear operation. Specifically, for transistors of substantially equal transconductance and threshold voltage, the self-bias voltage produced at input node 3 (and output terminal or "node" 4) will have a DC component equal to about half of the supply voltage (Vdd/2). If the transconductances and threshold voltages differ from the assumed condition, the DC component may be determined by plotting the amplifier input/output transfer function and locating the quiescent operating point by finding the intersection of the locus of the line Vin=Vout with the transfer characteristic curve.

The power supply noise component Vn at supply terminal 1 will vary the gate-to-source voltage Vgsp of transistor P1 during the first portion T1-T2 of the auto-zero interval T1-T3. This will cause drain current variations for transistor P1 and result in an amplified AC component of noise being present at input node 3 along with the desired DC component of the self-bias voltage. Accordingly, during the first portion T1-T2 of the self-bias interval T1-T3, the input coupling capacitor C1 will store a voltage equal to the difference between the input voltage V1 and the self-bias voltage (Vdd/2) plus the amplified noise KVn.

The self-bias noise component is suppressed during the second portion (T2-T3) of the self-bias interval (T1-T3) by opening switch 40 while leaving switch 30 closed. Several significant effects occur during this period. A first such effect is that when switch 40 is opened at time T2, the self-bias voltage sampled during the interval T1-T2 is thereby stored in capacitor C2. The voltage stored in capacitor C2 will, of course, include an incremental value attributable to the noise at the instant switch 40 is opened. For purposes of the present invention of biasing transistor P1, however, it is only necessary that capacitor C2 be charged to a value approximately equal to the DC component of the self-bias voltage. Stated another way, noise induced errors in storing the self-bias voltage in capacitor C2 have substantially no effect because capacitor C2 is not directly involved with comparing the input voltages V1 and V2. What capacitor C2 does is to apply a constant gate to source voltage Vgs to transistor P1. This maintains the transistor P1 drain current constant and thus essentially "noise free".

During the second half (T2-T3) of the auto-zero interval, the input coupling capacitor is charged to a potential equal to the difference between the input signal V1 and the now essentially noise free self-bias voltage produced at input node 3. It is instructive to note that if switch 40 were not open during the interval T2-T3, then node 3 would include an amplified noise component and the self-bias voltage stored in the coupling capacitor C1 upon opening switch 30 would thus also include a noise component. Unlike the situation with the bias capacitor C2, any noise component stored in the coupling capacitor C1 will cause uncorrectable comparison errors. The opening of switch 40 during the second half of the auto-zero interval results in the final charge applied to capacitor C1 being noise free and thus prevents such errors It is the early opening of switch 40 relative to the opening of switch 30 which prevents such errors.

At time T3 switch 30 is opened. This disables the negative feedback path for amplifier 5 and enables transistor N1 to provide amplification using transistor P1 as a load element. During the interval T3-T4 no signal is applied to input 3 thus allowing time for switching transients (if any) to decay.

At time T4 switch 20 is closed and switch 10 is opened thus beginning the comparison cycle (T4-T5) of the comparator. The opening of switch 10 isolates the coupling capacitor C1 from input terminal 8. Closure of switch 20 couples input signal V2 to input node 3 via coupling capacitor C1. Recall that capacitor C1 was previously charged to a potential equal to the difference between input voltage V1 and the self-bias voltage at node 3. Accordingly, when the voltage V2 is substituted for the voltage V1 during the compare interval, the voltage at node 3 will increase relative to the self-bias value if V2 is greater than V1 and so the output voltage at terminal 4 of the inverting amplifier 5 will decrease relative to its quiescent value (Vdd/2). Conversely, if input voltage V2 is less than V1 the input node voltage will decrease in proportion to the difference thus causing an amplified increase in the output voltage at terminal 4 above the quiescent (self-bias) value of Vdd/2.

It will be noted that noise present at supply terminal 1 has substantially no effect on the comparison since capacitor C2 provides constant bias to transistor P1 during the second half (T2-T3) of the auto-zero interval when input voltage V1 is being stored in capacitor C1 and this noise-free constant bias is applied during the comparison interval (T4-T5) when input signal V2 is applied to capacitor C1. Accordingly, the accuracy of the comparison is unaffected by the presence of noise at supply voltage terminal 1.

Switch 20 is opened at time T5 at the conclusion of the comparison period. There is a brief interval T5-T6 to allow switching transients time to decay and the comparison cycle repeats at time T6. In accordance with another aspect of the invention, switching transients may be suppressed in the comparator of FIG. 1 by implementing the switches with complementary MOS transistor transmission gates. This may be done with single transistor transmission gates by using an N-channel transistor for switch 30 and a P-channel transistor for switch 40 or vice versa. Alternatively, switches 30 and 40 may each be implemented with dual transistor transmission gates comprising pair of complementary transistors having parallel connected conduction paths and supplied with complementary gate control signals. If switch 30 is implemented with a single transistor transmission gate then switch 10 may be implemented with a similar gate so that when both switches are turned off (opened) similar turn-off transients are applied to the plates of coupling capacitor C1 and thus there is no net change in charge there stored due to the transient.

In accordance with another feature of the invention, it has been found desirable in certain applications (e.g., high speed analog to digital converters) to limit the value of the bias capacitor C2 to a range of about 0.1 to 5.0 pico-Farads. Capacitors much larger than the preferred range are relatively difficult to integrate and require a charging time that may be an appreciable portion of the auto-zero cycle thus precluding high speed operation (e.g., above 10 MHz). Capacitors much smaller than the preferred range may lack sufficient charge holding time to retain the self-bias voltage throughout the comparison interval and thus could result in inconsistent comparison results. A preferred value for the bias capacitor C2 is about 1.0 pico-Farads. It is preferred that the coupling capacitor C1 also be in the stated range of values and, preferably, of the same value as the bias capacitor C2.

In a typical analog-to-digital converter application the output at terminal 4 would be sensed prior to the end of the comparison interval and stored in a latch or applied to a decoder for further processing in the converter. In precision comparator applications, where it is desired to detect very small voltage differences, it may be desirable to amplify the output signal of the comparator of FIG. 1 prior to storage of the comparison result in a latch or use of the result elsewhere (e.g., in a decoder). Conventional self-biased CMOS amplifiers could be used for this purpose if the comparator output signal is very large relative to the power supply noise component. This, however, may not always be the case. In accordance with a further aspect of the invention, in applications where additional amplification is desired and power supply noise is expected, the additional amplification may be obtained by cascading an additional dynamically biased amplifier with the comparator of FIG. 1 as shown in FIG. 3.

Figure 3:
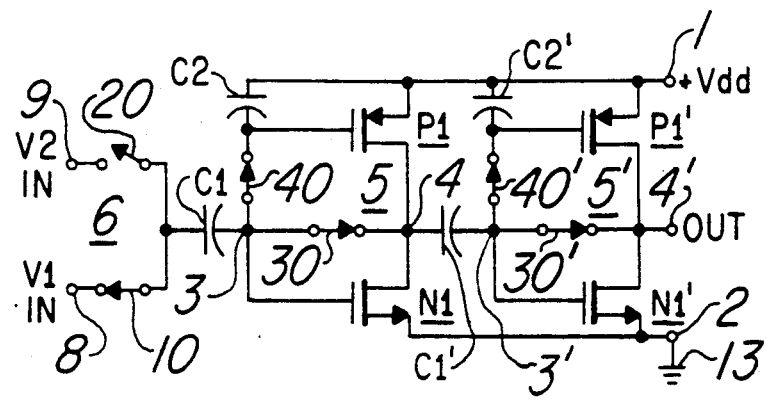
FIG. 3 is a circuit diagram illustrating a modification of the comparator of FIG. 1 providing increased comparator gain and noise rejection.
Figure 4:
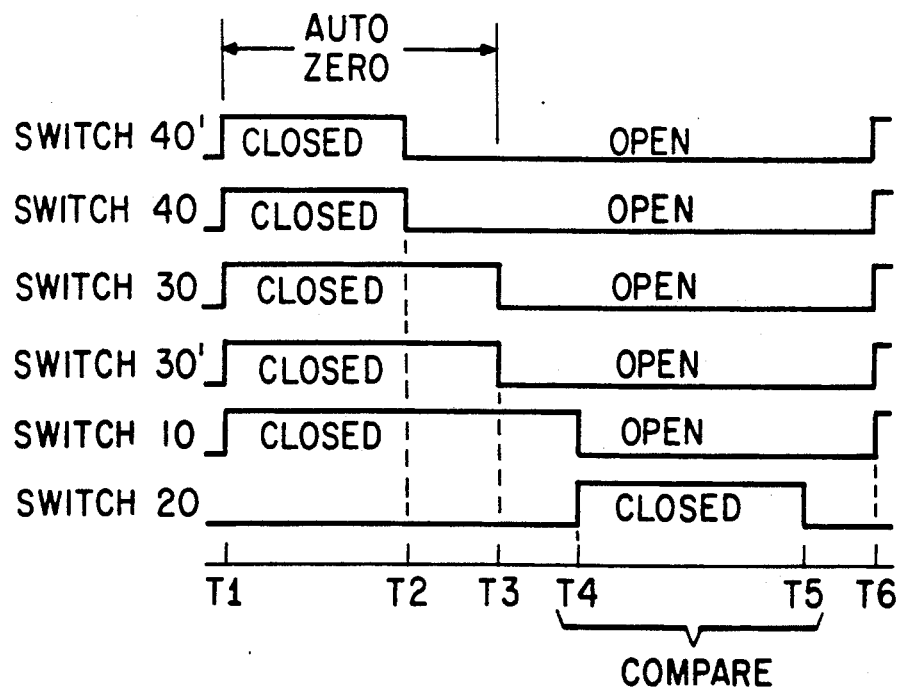
FIG. 4 is a timing diagram illustrating certain aspects of operation of the comparator of FIG. 3.

In FIG. 3 the output of the amplifier 5 is connected via a further coupling capacitor C1' to the input 3' of a further dynamically biased amplifier 5' that is substantially identical to amplifier 5. Similar elements of amplifier 5' are denoted by primed reference numbers. Timing signal generator 7 (not shown in FIG. 3) controls timing of the switches of the added amplifier relative to timing of the comparator switches as indicated in FIG. 4. Switch 30' is operated concurrently with switch 30 and switch 40' is operated concurrently with switch 40.

Operation of the modified comparator is similar to that previously described except that the added amplifier and coupling capacitor function as an additional comparator which compares the self-bias voltage produced by amplifier 5 during the second half (times T2-T3) of the auto-zero interval (T1-T3) with the output voltage produced by amplifier 5 during the compare interval (T4-T5). As in the case of the main amplifier 5, the cascaded amplifier 5' rejects power supply noise by sampling and storing the self-bias voltage in the bias capacitor C2' which maintains a constant gate-to-source voltage Vgs for transistor P1' during the second half of the auto-zero interval and throughout the compare interval.

Figure 5:
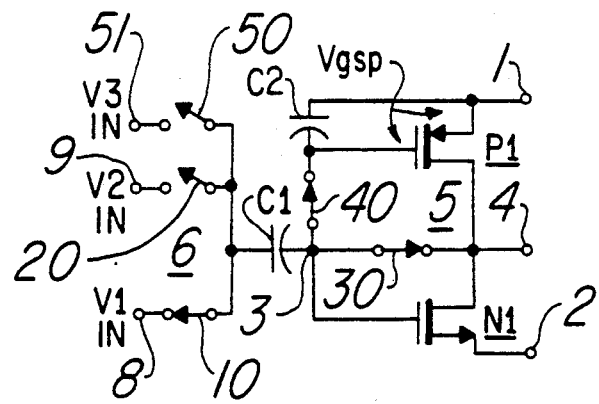
FIG. 5 is a circuit diagram illustrating a modification of the comparator of FIG. 1 providing multiple input signal comparisons.

In FIG. 5 the comparator of FIG. 1 is modified to include a further input terminal 51 for receiving an additional input signal V3. Terminal 51 is coupled to the input node 3 of amplifier 5 via coupling capacitor C1. This modification enables the comparison of any combination of input signals and is extendable by the addition of more input terminals and switches.

Figure 6:
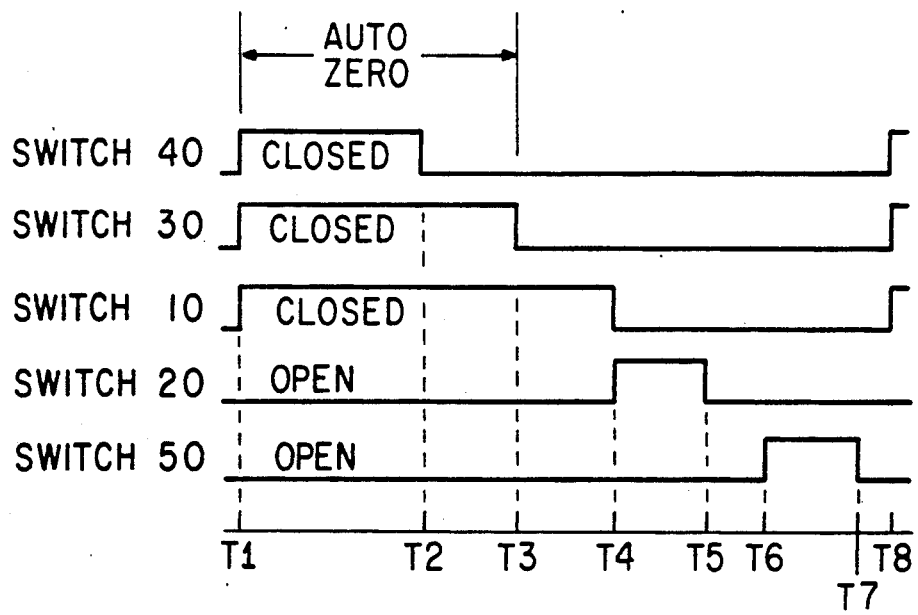
FIG. 6 is a timing diagram illustrating operation of the comparator of FIG. 5.

FIG. 6 illustrates operation of the comparator of FIG. 5 for comparing V1 with V2 and V1 with V3. The operation is the same as previously discussed with regard to FIG. 1 except that there are two compare intervals (T4-T5 and T6-T7) during the compare cycle (T1-T8) rather than one. After auto-zeroing (T1-T3) switch 20 is closed for comparing V2 with V1. This is followed a time later (T5-T6) by closure of the added switch 50 which results in a comparison of V3 with V1. To compare V2 with V1 or V3 one would close switch 20 during the auto-zero interval rather than switch 10 and then close the appropriate switch (10 or 50) during the compare interval to make the desired comparison with V1 or V3.

Figure 7:
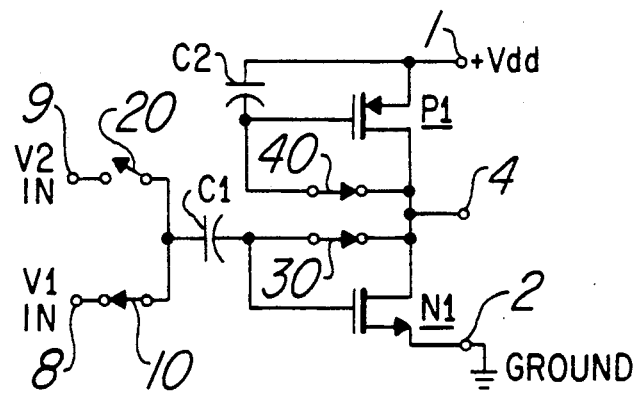
FIG. 7 is a circuit diagram illustrating a modification of the comparator of FIG. 1 providing an alternative switch connection.

In FIG. 7, the comparator of FIG. 1 is modified by connecting switch 40 between the gate of transistor P1 and the output terminal 4. Operation of the comparator is substantially the same as previously discussed except that the modification provides a path of lower impedance for charging the bias capacitor C2. The impedance is lower because charging current only flows through one switch (40) in the modified circuit whereas it flows through two switches (30 and 40) in the unmodified comparator. The lower impedance provided in the modified circuit improves the comparator operating speed by reducing the time required to charge the bias capacitor (time T1-T2, FIG. 2). The unmodified circuit is preferred in applications where integrated circuit layout considerations favor a topology in which the two switches, capacitor C1 and the P1 gate share a common circuit connection.

Figure 8:
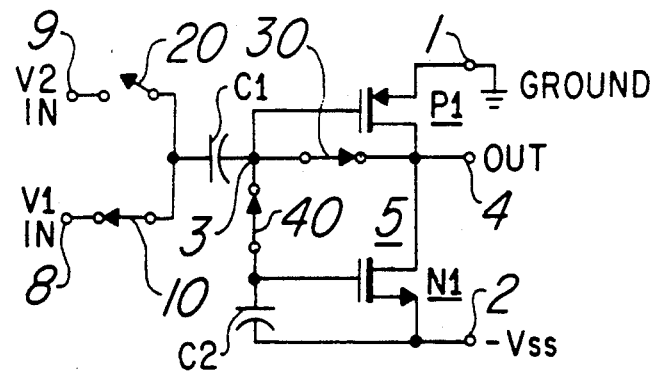
FIG. 8 is a circuit diagram illustrating a modification of the comparator of FIG. 1 for operation with a negative supply voltage source.

FIG. 8 illustrates a modification of the comparator of FIG. 1 for operation with negative supply voltage (−Vss). The modification comprises connecting supply terminals 1 and 2 to ground and Vss supplied, respectively. Since transistor N1 is now subject to gate-to-source (Vgs) noise effects, capacitor C2 is connected across its gate and source terminals with the gate being coupled to input node 3 via switch 40. Operation of the modified circuit is substantially the same as previously discussed except that transistor P1 provides amplification and transistor N1 provides a noise-free load for the amplifier 5. It will be noted that the modified circuit is equivalent to reversing the transistor types and the supply and ground connections (and supply polarity) in the unmodified circuit.

What is claimed is:

1. A method of comparing plural input signals, comprising the steps of:
    selectively applying said input signals to an amplifier having an input node and an output node;

coupling said input node and said output node together to produce a self-bias voltage for said amplifier during a first time interval when one of said input signals is applied;

coupling a storage capacitor to said input node and to said output node during a portion of said first time interval to store said self-bias voltage in said storage capacitor;

decoupling said storage capacitor from said input node and said output node during a second portion of said first time interval, said input node and said output node continuing to be coupled together during said second portion of said first time interval; and applying said stored voltage to a selected transistor of said amplifier for controlling the conduction thereof.

2. A method of comparing plural input signals as recited in claim 1 and further comprising the steps of:

selecting a value for said storage capacitor in the range of 0.1 to 5.0 pico-Farads; and continuously coupling said storage capacitor between a control electrode and one end of a conduction path of said selected transistor.

3. A method of comparing plural input signals, comprising the steps of:

sequentially applying said plural input signals to an input node of an amplifier via a coupling capacitor during respective ones of plurality non-overlapping time intervals;

applying negative feedback between said input node and an output node of said amplifier during a first one of said plural time intervals for developing a self-bias voltage at said nodes;

applying said self-bias voltage produced at a selected one of said input and output nodes to a storage capacitor during a first potion of said first one of said plural time intervals;

decoupling said storage capacitor from said selected one of said input and output nodes during a second portion of said first one of said plural time intervals and during all of the remaining said respective ones of plural time intervals, said negative feedback continuing to be applied during said second portion; and continuously coupling said storage capacitor to a control electrode of a first transistor of said amplifier.

4. A comparator, comprising:

an amplifier;

an input circuit for sequentially applying plural input signals to said amplifier;

a first bias circuit for producing a self-bias voltage for said amplifier during an entire first time period when a first one of said input signals is applied;

a second bias circuit selectively coupled to receive said self-bias voltage, said second bias circuit coupled between a control electrode of a selected transistor of said amplifier and one end of a conduction path of said selected transistor; and a timing circuit coupled to said second bias circuit for causing said second bias circuit to store said self-bias voltage during a first portion of said first time period when said first one of said input signals is applied, said timing circuit decoupling said second bias circuit from said self-bias voltage during a second portion of said first time period when said first one of said input signals is applied.

5. A comparator as recited in claim 4 wherein said second bias circuit comprises:

a capacitor connected between said control electrode and said one end of a conduction path of said selected transistor of said amplifier; and a switch connected between said control electrode of said selected transistor and a selected one of an input node and an output node of said amplifier, said switch being closed during said first portion of said first time period, and being open after said first portion of said first time period.

6. A comparator as recited in claim 4 wherein:

said selected transistor is a field effect transistor having source and gate electrodes; and said second bias circuit comprises a capacitor connected between said source and gate electrodes and a switch connected between said gate electrode and a selected one of an input node and an output node of said amplifier.

7. A comparator as recited in claim 6 wherein said capacitor has a capacitance value in the range of 0.1 to 5.0 pico-Farads.

8. The combination, comprising:

an input terminal, an output terminal, a first supply terminal and a second supply terminal;

first and second complimentary MOS transistors having drain electrodes connected to said output terminal and source electrodes connected to respective ones of said supply terminals;

said first transistor having a gate electrode coupled to said first supply terminal via a first capacitor and coupled to a selected one of said input and output terminals via a first switch;

said input terminal being further connected to a gate electrode of said second transistor and coupled via a second switch to said output terminal;

a timing signal generator unit coupled to said switches for controlling the operation thereof wherein said timing signal generator unit generates and supplies control signals to said switches for closing both switches during a first portion of a first time interval, for opening said first switch and keeping said second switch closed during a second portion of said first time interval and for keeping said first switch open and opening said second switch during a second time interval.

9. The combination as recited in claim 8 wherein said capacitor is of a value in the range of 0.1 to 5.0 pico-Farads.

10. The combination as recited in claim 8 further an input circuit for alternately applying first and second input signals to said input terminal of said amplifier via a coupling capacitor.

11. An amplifier, comprising:

an input node;

a first transistor having a control electrode connected to said input node and having a conduction path connected between an output node and a source of reference potential;

a second transistor having a conduction path connected between said output node and a source of supply voltage; and a switching circuit having a first operating mode for connecting said input node to said output node and to a control electrode of said second transistor, having a second operating mode for decoupling said input node from said control electrode of said second transistor while maintaining the connection between said input node and said output node, and having a third operating mode for decoupling said input node from said output node.

12. An amplifier, as recited in claim 11 and further comprising an input circuit responsive during said first and second operating modes of said switching circuit for applying a first input signal to said input node and responsive during said third operating mode of said switching circuit for applying a second input signal to said input node.

13. An amplifier, as recited in claim 11 wherein said switching circuit comprises a first switch connected between said input node and said output node and a second switch connected between said input node and said control electrode of said second transistor, said amplifier further comprising:
   a control circuit coupled to said input node and to said switches and having a first operating mode for closing both said switches and applying a first input signal to said input node, said control circuit having a second operating mode for keeping said first switch closed while opening said second switch, said control circuit having a third operating mode for opening said first switch while keeping said second switch open and applying a second input signal to said input node thereby causing an output signal to be produced at said output node indicative of the relative magnitudes of said input signals.

14. A comparator, comprising:
   an input terminal, first and second output terminals, a first supply terminal, and a second supply terminal;
   first and second complementary MOS transistors having drain electrodes connected to said first output terminal and source electrodes connected to respective ones of said supply terminals;
   said first transistor having a gate electrode coupled to said first supply terminal via a first capacitor and coupled to a selected one of said input and first output terminals via a first switch; said input terminal being further connected to a gate electrode of said second transistor and coupled via a second switch to said first output terminal;
   third and fourth complementary MOS transistors having drain electrodes connected to said second output terminal and source electrodes connected to respective ones of said supply terminals;
   said third transistor having a gate electrode coupled to said first supply terminal via a second capacitor and coupled to a selected one of said first output and second output terminals via a third switch; said first output terminal being further connected to a gate electrode of said fourth transistor and coupled via a fourth switch to said second output terminal; and
   a timing signal generator unit coupled to said switches for controlling the operation thereof wherein said timing unit generates and supplies control signals to said switches for closing all four switches during a first portion of a first time interval, for opening said first and third switches and keeping said second and fourth switches closed during a second portion of said first time interval and for keeping said first and third switches open and opening said second and fourth switches during a second time interval.

* * * * *